(12) United States Patent
Yamada (10) Patent No.: US 9,390,810 B2
(45) Date of Patent: Jul. 12, 2016

(54) SEMICONDUCTOR DEVICE AND CONTROL METHOD THEREOF

(71) Applicant: SOCIONEXT INC., Yokohama-shi, Kanagawa (JP)

(72) Inventor: Tomoyuki Yamada, Fussa (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/852,102

(22) Filed: Sep. 11, 2015

(65) Prior Publication Data

US 2016/0086677 A1    Mar. 24, 2016

(30) Foreign Application Priority Data

Sep. 22, 2014   (JP) .................. 2014-192422

(51) Int. Cl.
  *G11C 17/16*   (2006.01)
  *G11C 17/08*   (2006.01)
  *G11C 17/18*   (2006.01)

(52) U.S. Cl.
  CPC ............... *G11C 17/08* (2013.01); *G11C 17/18* (2013.01)

(58) Field of Classification Search
  CPC .................. G11C 17/16; G11C 7/22
  USPC ........................... 365/104, 189.05
  See application file for complete search history.

(56) References Cited

U.S. PATENT DOCUMENTS

| 5,297,096 A | * | 3/1994 | Terada ................... G11C 16/16 365/185.06 |
| 6,118,695 A | | 9/2000 | Yoneyama |
| 6,353,554 B1 | * | 3/2002 | Banks ................ G11C 11/5621 365/185.03 |
| 6,891,756 B2 | * | 5/2005 | Zink ................... G11C 16/3436 365/185.03 |
| 2010/0008133 A1 | * | 1/2010 | Cho ......................... G11C 8/10 365/163 |
| 2014/0211568 A1 | * | 7/2014 | Mui .................... G11C 11/5642 365/185.21 |

FOREIGN PATENT DOCUMENTS

| JP | 11-096776 A | 4/1999 |
| JP | 2001-043691 A | 2/2001 |
| JP | 2011-103154 A | 5/2011 |

* cited by examiner

*Primary Examiner* — Michael Tran
(74) *Attorney, Agent, or Firm* — Arent Fox LLP (57) ABSTRACT

In an OTP memory storing a one-bit of the data by two gate insulating film destruction type nonvolatile memory cells where a same bit line is connected and different word lines are connected, writings and readings of the data for selected two nonvolatile memory cells constituting one-bit are performed by simultaneously selecting the selected two nonvolatile memory cells, and verifications for the selected two nonvolatile memory cells are performed by individually selecting one and the other of the selected two nonvolatile memory cells one by one.

4 Claims, 5 Drawing Sheets

| DEC<i> | MODE | SEL | WLA<i> | WLB<i> | STATE |
|---|---|---|---|---|---|
| 1 | 1 | 1/0 | H | H | WRITING/NORMAL READING STATE(SELECT WLA,WLB) |
| 1 | 0 | 1 | H | L | VERIFICATION READING STATE(SELECT WLA) |
| 1 | 0 | 0 | L | H | VERIFICATION READING STATE(SELECT WLB) |
| 0 | 1/0 | 1/0 | L | L | ADDRESS NON-SELECTED STATE |

| | WRITE TIME | READING TIME, VERIFICATION TIME |
|---|---|---|
| SELECTED WL | VDD1 | VDD2 |
| NON-SELECTED WL | VSS | VSS |
| SELECTED BL | VSS | (VSS ⇒)Floating |
| NON-SELECTED BL | Floating | Floating |

(VDD1>VDD2)

| | WRITING(2 cell/bit) | | VERIFICATION READING (1 cell/bit×2) |
|---|---|---|---|
| | MC-A | MC-B | |
| Case1 | ○ | ○ | PASS |
| Case2 | ○ | WRITING DEFICIENCY/x | FAIL |
| Case3 | WRITING DEFICIENCY/x | ○ | FAIL |
| Case4 | WRITING DEFICIENCY | WRITING DEFICIENCY | FAIL |
| Case5 | × | × | FAIL |

|  | WRITING(2 cell/bit) | | VERIFICATION READING | FREQUENCY OF INCIDENCE OF FAILURE RESULTING FROM DETERIORATION |
|---|---|---|---|---|
|  | MC-A | MC-B | | |
| Case1 | ○ | ○ | PASS | POSSIBILITY IS VERY SMALL |
| Case2 | ○ | WRITING DEFICIENCY/× | PASS | POSSIBILITY IS INTERMEDIATE |
| Case3 | WRITING DEFICIENCY/× | ○ | PASS | POSSIBILITY IS INTERMEDIATE |
| Case4 | WRITING DEFICIENCY | WRITING DEFICIENCY | THERE IS POSSIBILITY OF PASS | POSSIBILITY IS LARGE |
| Case5 | × | × | FAIL | — |

SEMICONDUCTOR DEVICE AND CONTROL METHOD THEREOF

CROSS-REFERENCE TO RELATED APPLICATION

This application is based upon and claims the benefit of priority of the prior Japanese Patent Application No. 2014-192422, filed on Sep. 22, 2014, the entire contents of which are incorporated herein by reference.

FIELD

The embodiments discussed herein are directed to a semiconductor device and a control method thereof.

BACKGROUND

A one time programmable (OTP) memory is a nonvolatile memory capable of writing only one time. There are one using a floating gate type nonvolatile memory cell and one using a gate insulating film destruction type nonvolatile memory cell in the OTP memories.

Conventionally, there are a lot of OTP memories each using the floating gate type nonvolatile memory cell, but in recent years, the number of OTP memories each using the gate insulating film destruction type nonvolatile memory cell increases because elements are able to be manufactured by a normal CMOS process, and there is no dependence on technology. In the gate insulating film destruction type nonvolatile memory cell, a high voltage is applied on a gate insulating film of a field effect transistor and the gate insulating film is destroyed to thereby enable writing of data.

Besides, an art in which one-bit data is stored into a plurality of nonvolatile memory cells to thereby increase reliability is proposed (for example, refer to Patent Documents 1 to 3). For example, the plurality of nonvolatile memory cells where the same data are written are simultaneously read out, and thereby, it is possible to suppress an occurrence of read failure even when the data is lost caused by deterioration over time or the like at a certain nonvolatile memory cell after the writing of data.

[Patent Document 1] Japanese Laid-open Patent Publication No. 2001-43691
[Patent Document 2] Japanese Laid-open Patent Publication No. 2011-103154
[Patent Document 3] Japanese Laid-open Patent Publication No. 11-96776

For example, in arts described in Patent Document 1 and Patent Document 2, when the one-bit data is stored at the plurality of nonvolatile memory cells, the writings of data are performed for the nonvolatile memory cells one by one, and therefore, a cost for a writing process is large. For example, as it is described in Patent Document 3, the writings of data are simultaneously performed for two nonvolatile memory cells, readings of data are simultaneously performed for the two nonvolatile memory cells, and thereby, it is possible to reduce the cost for the writing process.

In the gate insulating film destruction type nonvolatile memory cell, when the writing of data is insufficient, it is known that deterioration of read current occurs caused by deterioration over time or the like of conductivity of the gate insulating film after destruction. Accordingly, a method in which the writings of data are simultaneously performed and the readings of data are simultaneously performed for two nonvolatile memory cells is applied for the OTP memory using the gate insulating film destruction type nonvolatile memory cell, there is a possibility in which it is determined to be a good product before shipment, but it becomes a bad product after shipment as illustrated in FIG. 8.

Figure 8:
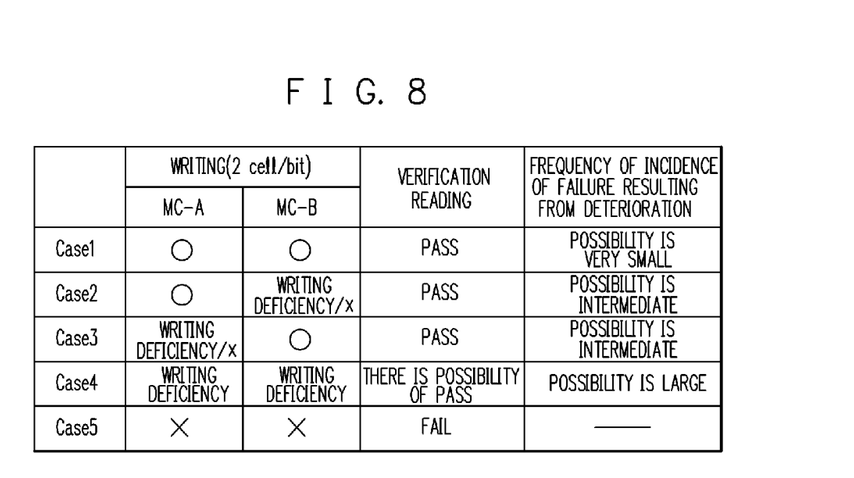
FIG. 8 is a view illustrating a determination result at a verification reading according to a conventional art.

FIG. 8 is a view to explain a determination example when writings of data are simultaneously performed and verifications (readings of data) are simultaneously performed for two nonvolatile memory cells MC-A, MC-B. In FIG. 8, in writing, "O" represents a state in which the data can be sufficiently written, and "x" represents a state in which the data cannot be written (write failure state). Besides, "writing deficiency" represents a state in which the writing of data is insufficient, but a little read current flows at a reading time, and it is a state easy to return to a non-writing state resulting from deterioration over time. It is determined to be the good product (PASS) at a verification time as long as the data can be written to either one of the two nonvolatile memory cells MC-A, MC-B.

Therefore, as illustrated in FIG. 8, it is determined to be the good product (PASS) if one of the two nonvolatile memory cells MC-A, MC-B is in the state of the writing deficiency or the writing failure (case 2 and case 3). There is a possibility that it is determined to be the good product (PASS) as long as the read current for a certain degree is obtained by the two nonvolatile memory cells MC-A, MC-B even if both of the two nonvolatile memory cells MC-A, MC-B are in the states of the writing deficiency (case 4).

In cases of the case 2, case 3, and case 4 illustrated in FIG. 8, a possibility of occurrence of read failure becomes high when deterioration of the read current at the reading time of data occurs resulting from deterioration over time or the like. In particular, in case of the case 4 in which both of the two nonvolatile memory cells MC-A, MC-B are in the states of the writing deficiency, the possibility of occurrence of read failure resulting from deterioration over time becomes very high.

SUMMARY

An aspect of a semiconductor device includes: a plurality of gate insulating film destruction type nonvolatile memory cells, a drive circuit configured to drive a plurality of word lines to select nonvolatile memory cells of the plurality of gate insulating film destruction type nonvolatile memory cells, and a write/read circuit where a plurality of bit lines to input and output the data for the selected nonvolatile memory cells are connected. Each of the plurality of nonvolatile memory cells includes a first and a second nonvolatile memory cells and stores a one-bit of the data by the first and second nonvolatile memory cells where the same bit line is connected and the different word lines are connected from each other. Writing and reading of the data for the selected nonvolatile memory cells are performed by simultaneously selecting the first and second nonvolatile memory cells, and verifications for the selected nonvolatile memory cells are performed by individually selecting one and the other of the first and second nonvolatile memory cells one by one.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, there will be described embodiments based on the drawings.

A semiconductor device according to an embodiment includes: a plurality of gate insulating film destruction type nonvolatile memory cells, and a one time programmable (OTP) memory which stores a one-bit data by two or more nonvolatile memory cells is included. The semiconductor device in the embodiment is, for example, an integrated circuit which includes a process circuit executing a certain process based on the data stored at the OTP memory in addition to the OTP memory. Hereinafter, an OTP memory storing a one-bit data by two gate insulating film destruction type nonvolatile memory cells is described as an example.

Figure 1:
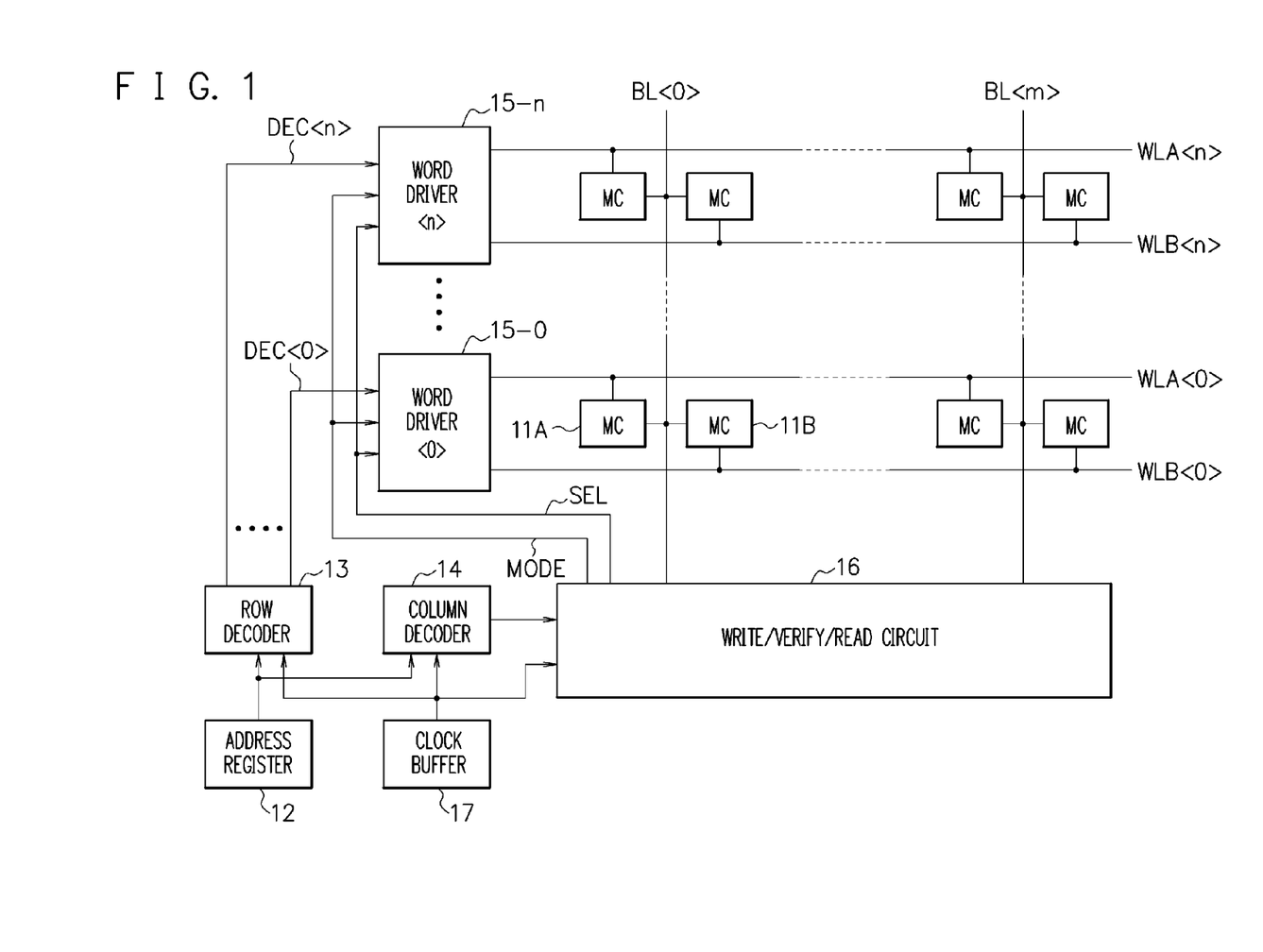
FIG. 1 is a view illustrating a configuration example of a semiconductor device according to a present embodiment.

FIG. 1 is a view illustrating a configuration example of the OTP memory included in the semiconductor device in the embodiment. As illustrated in FIG. 1, the OTP memory in the embodiment includes a plurality of nonvolatile memory cells (MC) 11, an address register 12, a row decoder 13, a column decoder 14, word drivers 15, a write/verify/read circuit 16, and a clock buffer 17.

The nonvolatile memory cell (MC) 11 is a gate insulating film destruction type nonvolatile memory cell, and includes two transistors of a memory cell transistor and a selection transistor as it is described later. The nonvolatile memory cell 11 is able to perform writing of data by applying a high voltage to a gate insulating film of a field effect transistor as the memory cell transistor to destroy the gate insulating film.

In the OTP memory of the embodiment, a one-bit data is stored by two nonvolatile memory cells being a pair of a first nonvolatile memory cell 11A and a second nonvolatile memory cell 11B at the same row and at the same column. In the OTP memory of the embodiment, the writing and reading (normal reading) of data are simultaneously performed for the two nonvolatile memory cells, and verification (verification reading) to verify whether or not the data is correctly written to the nonvolatile memory cell after the writing of data is separately performed for the nonvolatile memory cell one by one.

The nonvolatile memory cells 11 are connected to 2(n+1) pieces ("n" is a natural number) of word lines WLA, WLB disposed in a row direction to select the nonvolatile memory cells, and (m+1) pieces ("m" is a natural number) of bit lines BL disposed in a column direction to input/output data for the nonvolatile memory cells. The first nonvolatile memory cell 11A at an i-th row and a j-th column ("i" is an integer from "0" (zero) to "n", "j" is an integer from "0" (zero) to "m") is connected to a first word line WLA<i> at the i-th row and a bit line BL<j> at the j-th column. The second nonvolatile memory cell 11B at the i-th row and the j-th column is connected to a second word line WLB<i> at the i-th row and the bit line BL<j> at the j-th column. Namely, the two nonvolatile memory cells at the same row and the same column are connected to the same bit line BL, and connected to the different word lines WLA or WLB at the same row.

Figure 2A:
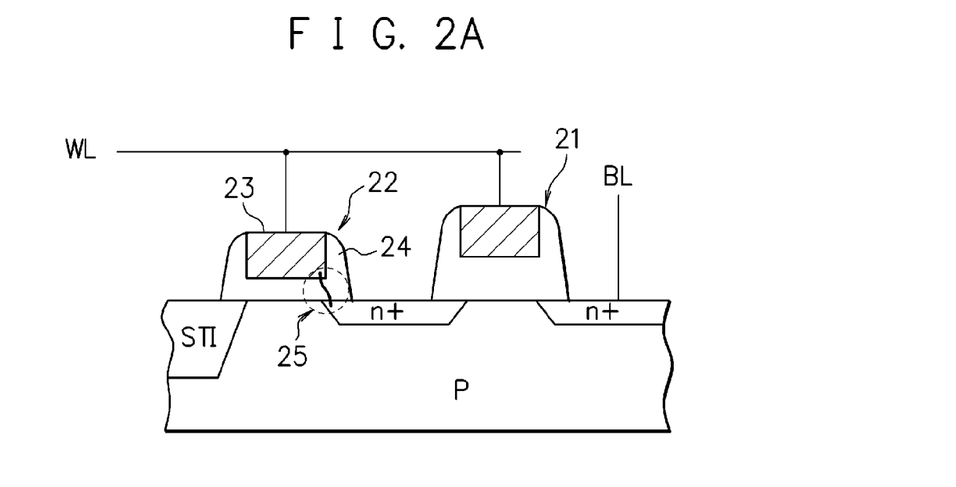
FIG. 2A is a view illustrating a configuration example of a nonvolatile memory cell according to the embodiment.

FIG. 2A is a sectional view illustrating a configuration example of the nonvolatile memory cell 11. The nonvolatile memory cell 11 includes a selection transistor 21 and a memory cell transistor 22. The selection transistor 21 is constituted by a high withstand voltage transistor where an element destruction does not occur even if a high voltage is applied on a gate electrode via a word line WL at a writing time of data. The memory cell transistor 22 is constituted by a transistor (core transistor) whose gate insulating film can be destroyed by applying the high voltage on the word line WL at the writing time of data.

The data is written to the nonvolatile memory cell 11 by applying the high voltage on a gate electrode 23 of the memory cell transistor 22 via the word line WL to destroy a gate insulating film 24 thereof. The reading of data from the nonvolatile memory cell 11 is performed by applying a certain voltage on the word line WL to set the selection transistor 21 in ON state (continuity state). The reading of data is performed by using that current flows for the bit line BL via the destroyed gate insulating film 24 (for example, a part 25 illustrated in the drawing) when the data is written, and current does not flow for the bit line BL via the gate insulating film 24 when the data is not written.

Figure 2B:
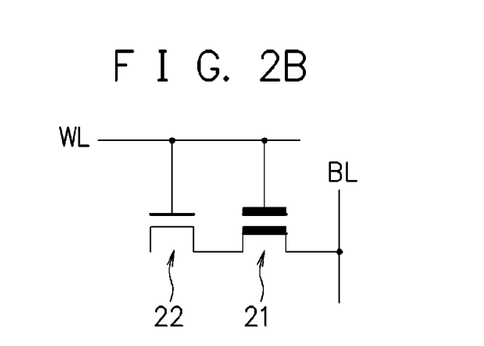
FIG. 2B and FIG. 2C are views each illustrating an equivalent circuit of the nonvolatile memory cell according to the embodiment.
Figure 2C:
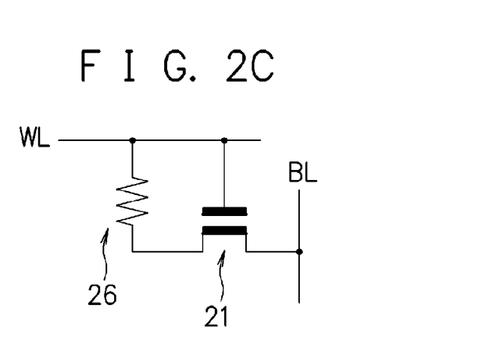

Namely, when the data is not written (non-writing state), an equivalent circuit of the nonvolatile memory cell 11 becomes a circuit illustrated in FIG. 2B. Therefore, when the data is not written, the current does not flow at the bit line BL even if a certain voltage is applied on the word line WL and the selection transistor 21 is turned on. On the other hand, when the data is written (writing state), the equivalent circuit of the nonvolatile memory cell 11 becomes a circuit illustrated in FIG. 2C, that is, the memory cell transistor 22 functions as a resistance 26 having conductivity. Therefore, when the data is written, the current flows at the bit line BL via the resistance 26 when the certain voltage is applied on the word line WL and the selection transistor 21 is turned on.

Return to FIG. 1, the address register 12 holds addresses (row addresses and column addresses) input from outside. The address register 12 supplies the held row address to the row decoder 13, and supplies the held column address to the column decoder 14. The clock buffer 17 supplies an operating clock to the row decoder 13, the column decoder 14, and the write/verify/read circuit 16.

The row decoder 13 decodes the row address supplied from the address register 12, and outputs a decode signal DEC<i> in accordance with a decoding result. Namely, the row decoder 13 asserts (sets to be "1" indicating to be "true") one of decode signals DEC<0> to DEC<n> based on the decoding result of the supplied row address. The column decoder 14 decodes the column address supplied from the address register 12, and outputs a decode signal in accordance with a decoding result. The column decoder 14 performs a selection or the like of the bit line BL<j> based on the supplied column address.

The write/verify/read circuit 16 includes a not-illustrated column switch, sense amplifier, voltage control unit, and so on. The write/verify/read circuit 16 performs a selection control of the bit lines BL, a voltage control of a word line power supply VWL, and so on by receiving the decode signal or the like from the column decoder 14. The write/verify/read circuit 16 outputs the data read out of the nonvolatile memory cell 11 toward outside. The write/verify/read circuit 16 performs the control of the word line power supply VWL at, for example, the writing time of data. The write/verify/read circuit 16 performs a control or the like of a reading time and a read voltage at, for example, a verification (verification reading) time.

The write/verify/read circuit 16 outputs a signal MODE and a signal SEL based on the supplied decode signal or the like. The signal MODE is a signal indicating an operation mode of the OTP memory. In this example, the signal MODE is set to be "1" at the writing time and reading (normal reading) time of data, and set to be "0" (zero) at the verification (verification reading) time. The signal SEL is a signal indicating the word lines WLA, WLB to be selected at the verification (verification reading) time. In this example, the signal SEL is set to be "1" when the first word line WLA is selected, and set to be "0" (zero) when the second word line WLB is selected.

The word driver 15 performs a drive control of the word lines WLA, WLB in accordance with the signals DEC, MODE, SEL. The word lines WLA<i>, WLB<i> at the i-th row are connected to a word driver <i>15-i. The word driver <i>15-i receives the decode signal DEC<i> from the row decoder 13 and the signal MODE and the signal SEL from the write/verify/read circuit 16, and drives the word lines WLA<i>, WLB<i> in accordance with these signals.

Figure 3A:
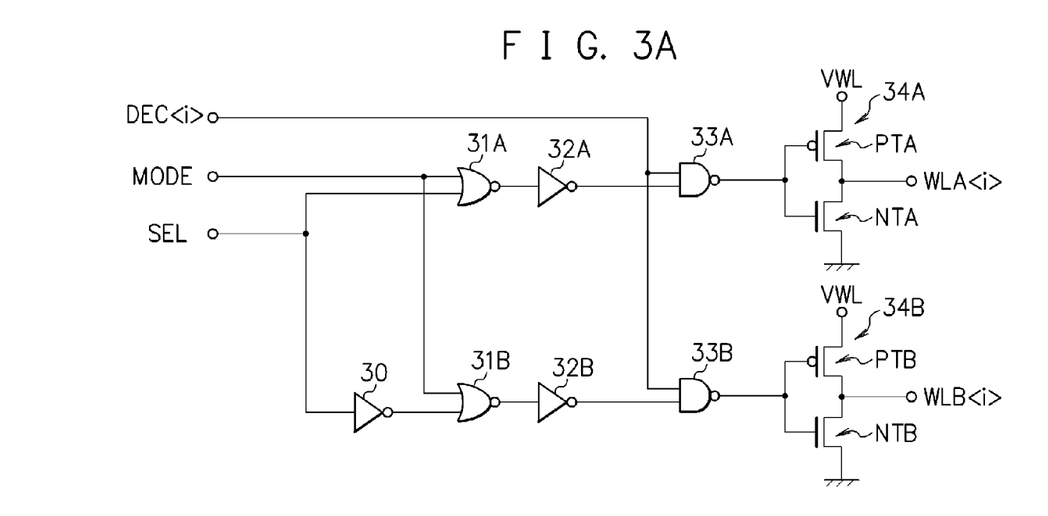
FIG. 3A is a view illustrating a configuration example of a word driver according to the embodiment.

FIG. 3A is a view illustrating a configuration example of the word driver <i>15-i. The word driver <i>15-i includes inverters 30, 32A, 32B, negative logical sum operation circuits (NOR circuits) 31A, 31B, negative logical product operation circuits (NAND circuits) 33A, 33B, and drivers (inverters) 34A, 34B.

At the NOR circuit 31A, the signal MODE and the signal SEL are input, and an operation result is output. At the NOR circuit 31B, the signal MODE and the signal SEL which is inverted by the inverter 30 are input, and an operation result is output. At the NAND circuit 33A, the signal DEC<i> and the output of the NOR circuit 31A which is inverted by the inverter 32A are input, and an operation result is output. At the NAND circuit 33B, the signal DEC<i> and the output of the NOR circuit 31B which is inverted by the inverter 32B are input, and an operation result is output.

The driver (inverter) 34A includes a p-channel type transistor PTA and an N-channel type transistor NTA where the output of the NAND circuit 33A is supplied to each gate thereof. In the transistor PTA, a source is connected to the word line power supply VWL, and a drain is connected to a drain of the transistor NTA. In the transistor NTA, a source is connected to a reference potential VSS. The first word line WLA<i> is connected to a connection point between the drain of the transistor PTA and the drain of the transistor NTA.

The driver (inverter) 34B includes a p-channel type transistor PTB and an N-channel type transistor NTB where the output of the NAND circuit 33B is supplied to each gate thereof. In the transistor PTB, a source is connected to the word line power supply VWL, and a drain is connected to a drain of the transistor NTB. In the transistor NTB, a source is connected to a reference potential VSS. The second word line WLB<i> is connected to a connection point between the drain of the transistor PTB and the drain of the transistor NTB.

When the signal DEC<i> is "1" and the signal MODE is "1", both of the outputs of the NOR circuits 31A, 31B become "0" (zero), and both of the outputs of the NAND circuits 33A, 33B become "0" (zero). Accordingly, at the drivers (inverters) 34A, 34B, the transistors PTA, PTB are in ON states (continuity states), and the transistors NTA, NTB are in OFF states (non-continuity states), and the first word line WLA<i> and the second word line WLB<i> are connected to the word line power supply VWL. Namely, the word driver <i>15-i sets both of the connected first word line WLA<i> and second word line WLB<i> at the i-th row in high-level (selected states) when it is at the writing time or the reading (normal reading) time of data, and the corresponding row is address-selected.

When the signal DEC<i> is "1", the signal MODE is "0" (zero), and the signal SEL is "1", the output of the NOR circuit 31A becomes "0" (zero), and the output of the NAND circuit 33A becomes "0" (zero). Therefore, at the driver (inverter) 34A, the transistor PTA is in ON state (continuity state), the transistor NTA is in OFF state (non-continuity state), and the first word line WLA<i> is connected to the word line power supply VWL. At this time, the output of the NOR circuit 31B becomes "1", and the output of the NAND circuit 33B becomes "1". Therefore, at the driver (inverter) 34B, the transistor PTB is in OFF state (non-continuity state), the transistor NTB is in ON state (continuity state), and the second word line WLB<i> is connected to the reference potential VSS. Namely, the word driver <i>15-i sets the connected first word line WLA<i> in high-level (selected state) and the second word line WLB<i> in low-level (non-selected state) at the i-th row when it is the verification (verification reading) time, the corresponding row is address-selected, and the signal SEL is "1".

When the signal DEC<i> is "1", the signal MODE is "0" (zero), and the signal SEL is "0" (zero), the output of the NOR circuit 31A becomes "1", and the output of the NAND circuit 33A becomes "1". Therefore, at the driver (inverter) 34A, the transistor PTA is in OFF state (non-continuity state), the transistor NTA is in ON state (continuity state), and the first word line WLA<i> is connected to the reference potential VSS. At this time, the output of the NOR circuit 31B becomes "0" (zero), and the output of the NAND circuit 33B becomes "0" (zero). Therefore, at the driver (inverter) 34B, the transistor PTB is in ON state (continuity state), the transistor NTB is in OFF state (non-continuity state), and the second word line WLB<i> is connected to the word line power supply VWL. Namely, the word driver <i>15-i sets the connected first word line WLA<i> in low-level (non-selected state) and the second word line WLB<i> in high-level (selected state) at the i-th row when it is the verification (verification reading) time, the corresponding row is address-selected, and the signal SEL is "0" (zero).

When the signal DEC<i> is "0" (zero), both of the outputs of the NAND circuits 33A, 33B become "1". Therefore, at the drivers (inverters) 34A, 34B, the transistors PTA, PTB are in OFF states (non-continuity states), the transistors NTA, NTB are in ON states (continuity states), and the first word line WLA<i> and the second word line WBL<i> are connected to the reference potential VSS. Namely, the word driver <i>15-i sets both of the connected first word line WLA<i> and second word line WLB<i> at the i-th row in low-level (non-selected states) when the corresponding row is not address-selected.

Figure 3B:
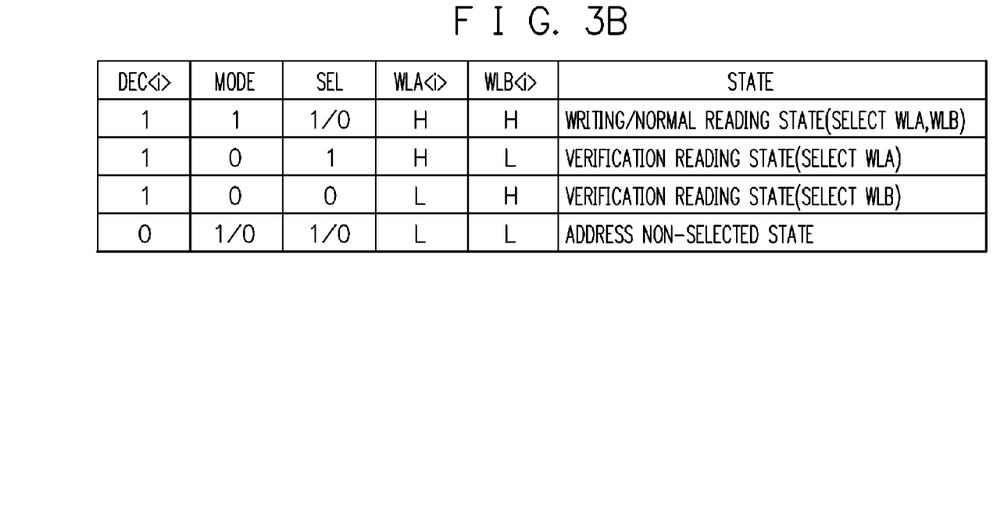
FIG. 3B is a view to explain operations of the word driver according to the embodiment.

The operations of the word driver <i>15-i are summarized to be a table illustrated in FIG. 3B. Namely, at an address selection time at the decoder, the word driver <i>15-i performs a word line selection control at the writing time or reading (normal reading) time, and at the verification (verification reading) time of data by the signal MODE. At the writing time or the reading (normal reading) time of data, the word driver <i>15-i selects two word lines. At the verification (verification reading) time, the word driver <i>15-i selects one word line. At the verification (verification reading) time, the word driver <i>15-i determines either of the word line WLA<i> or WLB<i> is to be selected by the signal SEL.

As stated above, in the embodiment, a control in which the two nonvolatile memory cells are simultaneously selected at the writing time or reading (normal reading) time of data, and the nonvolatile memory cell is selected one by one at the verification (verification reading) time becomes possible. A configuration of the word driver <i>15-i illustrated in FIG. 3A is an example, and is not limited thereto. As illustrated in FIG. 3B, any configuration will do as long as the selection control of the word lines WLA<i>, WLB<i> in accordance with the signals DEC<i>, MODE, SEL can be performed, and the configuration thereof is arbitrary.

Figure 4:
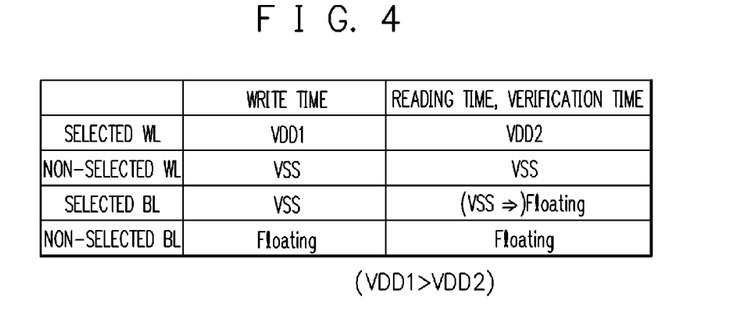
FIG. 4 is a view illustrating an example of an applied voltage at an operating time according to the embodiment.

FIG. 4 is a view illustrating an example of an applied voltage at each operation time in the embodiment. At the writing time of data for the nonvolatile memory cell, the word line power supply VWL is controlled to be a voltage VDD1, the voltage VDD1 is applied on the selected word line, and the non-selected word line is set to be the reference potential VSS. And the selected bit line is set to be the reference potential VSS, and the non-selected bit line is set to be a floating state. The voltage VDD1 is a voltage higher than a voltage VDD2 which is applied at the reading (normal reading) time or the verification (verification reading) time of data.

At the reading (normal reading) time or the verification (verification reading) time of data for the nonvolatile memory cell, the word line power supply VWL is controlled to be the voltage VDD2, the voltage VDD2 is applied on the selected word line, and the non-selected word line is set to be the reference potential VSS. And the selected bit line is set to be the floating state after pre-charged to be the reference potential VSS, and the non-selected bit line is set to be the floating state.

Figure 5:
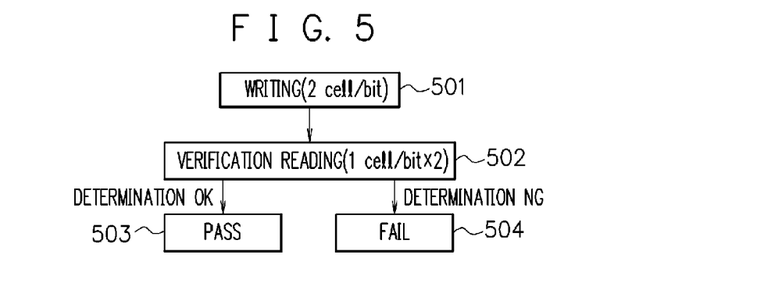
FIG. 5 is a view illustrating an example of an operation sequence relating to the semiconductor device according to the embodiment.

FIG. 5 is a view illustrating an example of an operation sequence in the embodiment. In FIG. 5, an operation sequence of a writing process including the writing and verification (verification reading) of data is illustrated.

One word driver <i>15-i is selected by the decode signal DEC<i> in accordance with the decoding result of the row address. Further, the control is set by the signal MODE to be one selecting two word lines, and the selected word driver <i>15-i simultaneously selects the connected two word lines WLA<i>, WLB<i>, and thereby, the writings of data are simultaneously performed for the two nonvolatile memory cells 11A, 11B constituting one bit (501).

Next, the control is switched by the signal MODE to be one selecting either one of the two word lines. The selected word driver <i>15-i selects either one of the connected two word lines WLA<i>, WLB<i> by the signal SEL, and thereby, the verification for one of the nonvolatile memory cells 11A, 11B is performed. When the verification is successful, the selected word driver <i>15-i selects the other word line by the signal SEL, and thereby, the verification for the other of the nonvolatile memory cells 11A, 11B is performed (502).

As a result of the verification, if the verifications are successful for both of the nonvolatile memory cells 11A, 11B, it is determined to be PASS (503), and determined to be FAIL if the verification is not successful in either one of them (504), and the writing process is finished. The determination in the verification is performed by, for example, outputting the read data from the write/verify/read circuit 16 to outside, and comparing with an expected value by a tester, an evaluation circuit, and so on.

Note that in the reading (normal reading) of data, one word driver <i>15-i is selected by the decode signal DEC<i> in accordance with the decoding result of the row address. Further, the control is set by the signal MODE to be one selecting two word lines, then the selected word driver <i>15-i simultaneously selects the connected two word lines WLA<i>, WLB<i>, and thereby, the reading of data is simultaneously performed for the two nonvolatile memory cells 11A, 11B constituting one bit.

According to the embodiment, in the OTP memory in which the one-bit data is stored at the first nonvolatile memory cell 11A and the second nonvolatile memory cell 11B, the writing or reading is performed by simultaneously selecting the two nonvolatile memory cells at the writing time or reading (normal reading) time of data. At the verification (verification reading) time in which it is verified whether or not the data is correctly written to the nonvolatile memory cell after the writing of data, the nonvolatile memory cell is independently selected one by one to perform the verification.

Figure 6:
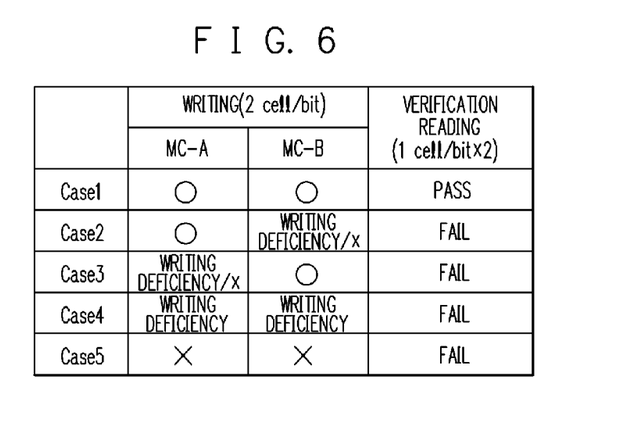
FIG. 6 is a view illustrating a determination result at a verification reading according to the embodiment.

It is thereby determined to be a bad product (FAIL) in the embodiment in the cases when one of the two nonvolatile memory cells MC-A, MC-B constituting one-bit is in the writing deficiency or the writing failure (case 2 and case 3) where it is determined to be a good product (PASS) according to the conventional method as illustrated in FIG. 6. Besides, it is determined to be a bad product (FAIL) in the embodiment in the case when both of the two nonvolatile memory cells MC-A, MC-B constituting one-bit are in the writing deficiency (case 4) where there is a possibility in which it is determined to be a good product (PASS) according to the conventional method.

Namely, in the embodiment, it is determined to be a good product (PASS) in the verification only the case when the data can be sufficiently written to both of the two nonvolatile memory cells MC-A, MC-B constituting one-bit (case 1). As a result, frequency of incidence of failure resulting from deterioration becomes small, and high reliability can be secured.

Besides, a time for the verification (verification reading) at the writing process is very short compared to a time for the writing of data, and therefore, a time to perform the writing process seldom increases even if the verification is performed by individually selecting the nonvolatile memory cells one by one. Therefore, according to the embodiment, it is possible to improve reliability of data after the writing while suppressing the increase in the cost of the writing process.

The gate insulating film destruction type nonvolatile memory cell is able to additionally perform the writing of data even when it is determined to be FAIL by the verification. It is allowed to perform the additional writing for the nonvolatile memory cell in which the writing of data is already completed. Therefore, as illustrated in FIG. 7, the writing of data may be performed again when it is determined to be FAIL by the verification.

Figure 7:
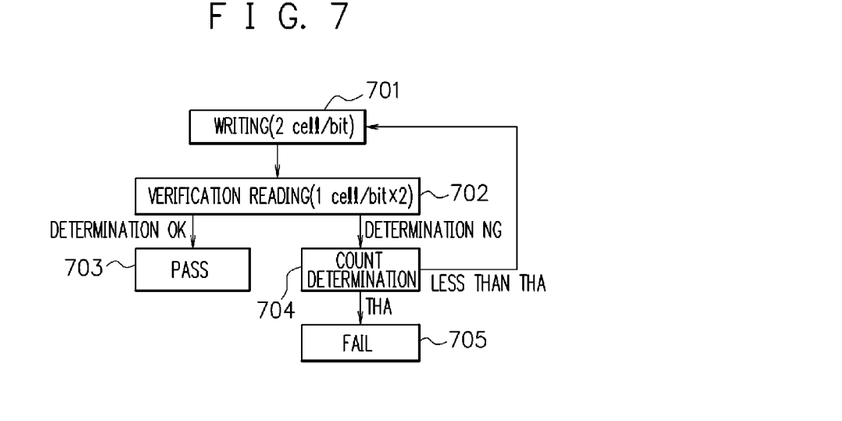
FIG. 7 is a view illustrating another example of the operation sequence relating to the semiconductor device according to the embodiment.

FIG. 7 is a view illustrating another example of the operation sequence in the embodiment. In FIG. 7, the operation sequence of the writing process including the writing and verification (verification reading) of data is illustrated.

Similar to the operation sequence illustrated in FIG. 5, the writings of data are simultaneously performed for the two nonvolatile memory cells 11A, 11B constituting one-bit (701), and the verification is performed for the nonvolatile memory cell one by one (702). As a result of the verification, when the verifications are successful for each of the nonvolatile memory cells 11A, 11B, it is determined to be PASS (703), and the writing process is finished.

On the other hand, when the verification is not successful in either one of the nonvolatile memory cells 11A, 11B as a result of the verification, a determination of a count value representing the number of times of the writing and verification (verification reading) of data is performed (704). When the count value is less than a threshold value THA as a result of the determination, the count value is increased by one, and the writings of data for the two nonvolatile memory cells 11A, 11B are performed again (701). When the count value is the threshold value THA as a result of the determination, it is determined to be FAIL (705), and the writing process is finished.

A disclosed semiconductor device is able to improve reliability of data after writing while suppressing increase in cost of a writing process.

Incidentally, the above-described embodiments are to be considered in all respects as illustrative and no restrictive. Namely, the present invention may be embodied in other specific forms without departing from the spirit or essential characteristics thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
    a plurality of nonvolatile memory cells where writings of data are each performed by destroying a gate insulating film;
    a drive circuit configured to drive a plurality of word lines to select nonvolatile memory cells of the plurality of nonvolatile memory cells; and
    a write/read circuit where a plurality of bit lines to input and output the data for the selected nonvolatile memory cells are connected,
    wherein each of the plurality of nonvolatile memory cells includes a first and a second nonvolatile memory cells and stores a one-bit of the data by the first and second nonvolatile memory cells, the first and second nonvolatile memory cells being connected to the same bit line and connected to the different word line from each other, and
    writings and readings of the data for the selected nonvolatile memory cells are performed by simultaneously selecting the first and second nonvolatile memory cells by the drive circuit, and verifications for the selected nonvolatile memory cells are performed by individually selecting one and the other of the first and second nonvolatile memory cells one by one by the drive circuit.

2. The semiconductor device according to claim 1,
    wherein each of the first and second nonvolatile memory cells includes a selection transistor and a memory cell transistor in which the word line is connected to each gate thereof, and the writing of the data is performed by applying a voltage to the gate insulating film of the memory cell transistor to thereby destroy the gate insulating film.

3. A control method of a semiconductor device including a plurality of nonvolatile memory cells each of which is connected to a word line and a bit line, includes a first and second nonvolatile memory cells, and stores a one-bit of data by the first and second nonvolatile memory cells, and for each of which writing of the data is performed by destroying a gate insulating film, the first and second nonvolatile memory cells being connected to the same bit line and connected to the different word line from each other, the control method of the semiconductor device comprising:
    simultaneously selecting the first and second nonvolatile memory cells to perform the writings of the data for nonvolatile memory cells of the plurality of nonvolatile memory cells;
    performing, by independently selecting one and the other of the first and second nonvolatile memory cells one by one, verifications for the nonvolatile memory cells for which the writings of the data are performed; and
    performing, by simultaneously selecting the first and second nonvolatile memory cells, readings of the data for the nonvolatile memory cells for which the writings of the data are performed.

4. The control method of the semiconductor device according to claim 3, wherein
    when the nonvolatile memory cells for which the writings of the data are performed include a nonvolatile memory cell where the data is not correctly written as a result of the verifications, the writing of data for the nonvolatile memory cell where data is not correctly written is performed again.

* * * * *